United States Patent [19]

Moriyama et al.

[11] Patent Number: 5,467,758
[45] Date of Patent: Nov. 21, 1995

[54] ELECTRONIC DISTRIBUTING TYPE IGNITION DEVICE

[75] Inventors: Norio Moriyama, Toukai; Noboru Sugiura, Mito, both of Japan

[73] Assignee: Hitachi, Ltd., Japan

[21] Appl. No.: 290,084

[22] Filed: Aug. 15, 1994

[30] Foreign Application Priority Data

Aug. 13, 1993 [JP] Japan .................... 5-201383

[51] Int. Cl.⁶ .................... F02P 7/02
[52] U.S. Cl. .................... 123/617; 361/707
[58] Field of Search .................... 123/647, 617, 123/633, 634, 594, 635; 361/247, 381–384, 386–389, 395, 399, 424; 363/141; 165/80.3

[56] References Cited

U.S. PATENT DOCUMENTS

| | | | |
|---|---|---|---|
| 4,951,641 | 8/1990 | Takaishi et al. | 123/647 |
| 5,003,959 | 4/1991 | Umezaki et al. | 123/647 |
| 5,044,328 | 9/1991 | Umezaki | 123/647 |
| 5,075,822 | 12/1991 | Baumler et al. | 361/388 |
| 5,159,532 | 10/1992 | Kilian et al. | 361/388 |
| 5,365,909 | 11/1994 | Sawazaki et al. | 123/617 |
| 5,381,773 | 1/1995 | Straub | 123/647 |

*Primary Examiner*—Raymond A. Nelli
*Attorney, Agent, or Firm*—Evenson, McKeown, Edwards & Lenahan

[57] ABSTRACT

In order to mount a power transistor chip, a multilayered member formed by fixing a molybdenum plate to a copper base is flattened by eliminating its deformation in the member caused by heated fixing through elastic working, it is possible to prevent cracking in a power transistor chip or a solder layer caused by the deformation. Especially, it is possible to improve the reliability of an electronic distributing type ignition device mounted on an engine block formed in a unit of an ignition controller and an ignition coil.

3 Claims, 3 Drawing Sheets

ELECTRONIC DISTRIBUTING TYPE IGNITION DEVICE

BACKGROUND OF THE INVENTION

1. Field of the Invention

The present invention relates to an electronic distributing type ignition device for internal combustion engine, and more particularly to an electronic distributing type ignition device characterized by multilayered structure to mount power transistor into the ignition controller in an ignition coil with build-in ignition controller.

2. Description of the Related Art

An ignition controller in ignition device for internal combustion engine is used for control the primary current in an ignition coil intermittently. In a general ignition device, the ignition coil and the ignition control device are separated. However, an ignition coil with build-in ignition controller, in which an ignition controller having a power transistor and an ignition coil are formed in a unit, is recently developed. The ignition coil with build-in ignition controller of this kind is poor in thermal radiation owing to being mounted on the engine block to increase its temperature. Therefore, the ignition controller requires to pay a sufficient attention against high temperature, and it is necessary to take the materials and combination used into the greatest possible consideration. Especially, for the multilayered chip structure in a power transistor part, cracking is apt to take place in the solder material in the multilayer part when the temperature goes beyond its operating environment range, in particular, its operating temperature range. for this reason, the multilayered structure is generally formed with taking the difference between thermal expansion coefficients into consideration. However, from a cost decreasing point of view, it is forced to use a low cost material even when the thermal expansion coefficient is largely different. Or in some cases, distortion is caused in the member due to the temperature during soldering to make the controller low thermal resistant.

In other words, the multilayer structure of power transistor chip is determined through considering how efficiently the heat generated the power transistor using silicon chip, that is, a power source, is transferred, and how the thermal expansion difference due to the temperature difference in the operating environment is absorbed. For example, in a case where a molybdenum plate is used as an absorbing material for thermal expansion difference, when the molybdenum plate and a copper heat sink are fixed to each other with solder in advance, these members are heated at temperature of approximately 650° C. to melt the solder. In this time, since the linear expansion coefficient of molybdenum is $5.5 \times 10^{-6}/°C$. and the linear expansion coefficient of copper is $1.67 \times 10^{-6}/°C$., the fixed portion is some times arched due to the difference between the both linear expansion coefficients or due to the fix strength of the fixing solder, or embrittlement is caused in addition to arching depending on the composition of the copper heat sink. In order to avoid these, the following countermeasures have been taken: controlling the fixing area between the molybdenum plate and the copper base to be fixed, employing another structure, for example, such as fixing between the molybdenum plate and an alumina plate or using a copper plate instead of the molybdenum plate.

SUMMARY OF THE INVENTION

The present invention has been made in the light of these facts in the prior art. An object of the present invention is to provide an electronic distributing type ignition device composed of an ignition controller and an ignition coil and formed in a unit. And further, even if the any thermal distortion is occurred in the structural member owing to temperature change during heat fixing, the distortion does not affect the multilayered structure mounting a power transistor chip.

The object of the present invention can be attained by such a way that a power transistor for an ignition coil control in an ignition controller to be formed in a unit with each of the ignition coils is fixed to and mounted on a molybdenum plate which is fixed to the fixing surface of a copper base with solder and each of the surfaces is made into flat-shape to form a multilayer member of molybdenum plate.

It is preferable to form each surface of the copper base and the multilayer member of molybdenum plate in flat-shape through plastic working. And the flat-shaped copper base is also utilized for mounting a hybrid IC substrate.

DETAILED DESCRIPTION OF THE PREFERRED EMBODIMENTS

An embodiment of an electronic distributing type ignition device for internal combustion engine according to the present invention will be described below, referring to the accompanying drawings.

Figure 1:
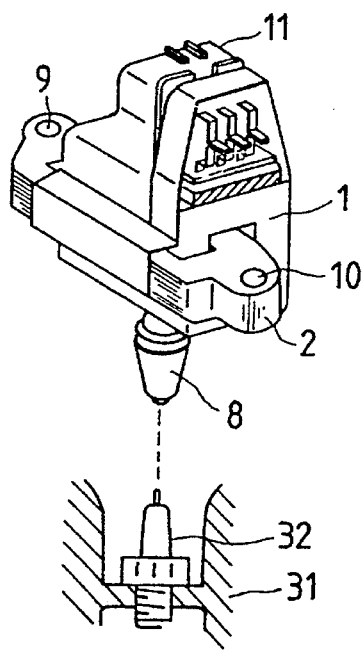
FIG. 1 is a perspective view of one embodiment of an ignition coil with build-in ignition controller in accordance with the present invention.
Figure 2:
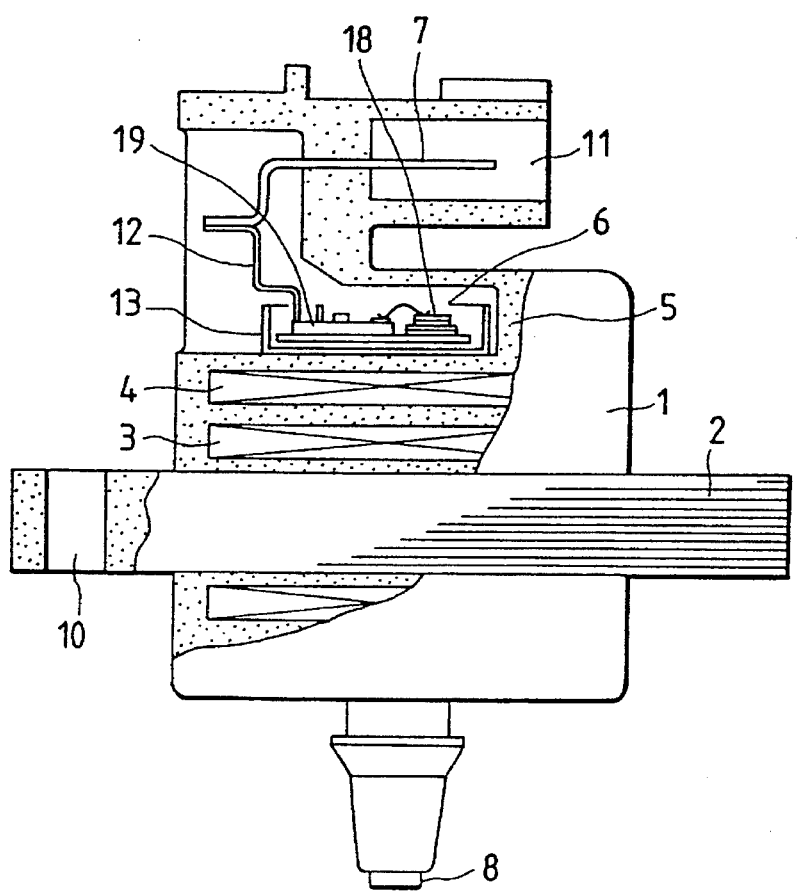
FIG. 2 is a partially sectional view showing the internal structure of the ignition coil in FIG. 1.

FIG. 1 is a perspective view of one embodiment of an ignition coil with build-in ignition controller in accordance with the present invention. FIG. 2 is a cross-sectional view showing the internal structure of the ignition coil in FIG. 1.

In these figures, the electronic distributing type ignition device 1 comprises a core 2, a primary coil 3 and a secondary coil 4 winding around the core 2, a mold 5 covering the both coils 3, 4, an ignition controller 6 mounted on the mold 5 in forming a unit, a terminal 7 connected to the ignition controller 6, and a high voltage electrode 8 projecting downward from the bottom of the mold 5 electrically to connect to a spark plug 32 attached to an engine block 31. The core 2 has screw holes 9, 10 for fixing on the both end portions in its longitudinal direction, the terminal 7 being placed in a connector part 11 formed on the top end of the mold 5. The connector 11 receives control signal and electric power form an external control unit which is not shown in the figure and outputs to the ignition controller 6 through the terminal 7 and a lead frame 12.

Figure 3:
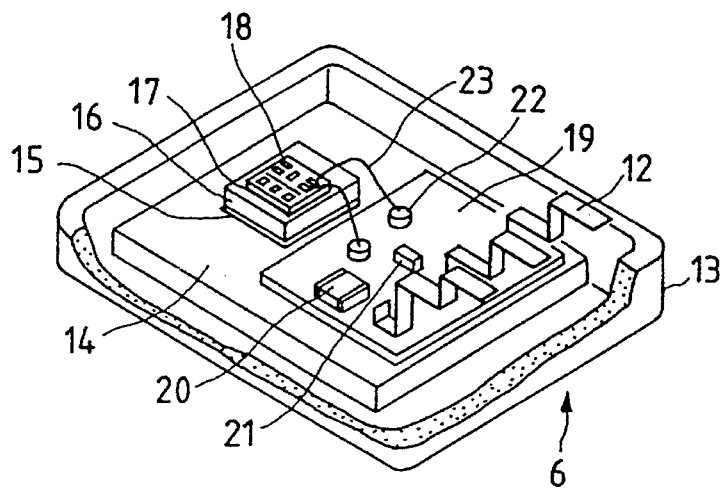
FIG. 3 is a perspective view showing one unit of an ignition controller the case of which is partially cut away.

The ignition controller 6, as shown in the perspective view of FIG. 3, basically comprises a copper heat sink (copper base) 14 mounted on a case 13, a molybdenum plate 16 fixed to the copper base 14 with a solder member 15 made of silver solder, a power transistor chip 18 fixed on the molybdenum plate 16 with solder 17, and a hybrid IC substrate 19 fixed on the copper base 14 at a place other than the place the molybdenum plate 16 is fixed with adhesive which is not shown in the figure. Electronic parts 20, 21 are mounted on the hybrid IC substrate 19, the lead frame 12 being projected upward to connect the wiring pattern of the hybrid IC substrate 19 to the terminal 7. The power transistor chip 18 is connected to an aluminum pad 22 provided on the hybrid IC substrate 19 through a wire 23 to transmit control signal through the wire 23. The lead frame 12 is fixed to the terminal 7 with welding to be conducted to the external. The case 13 is made of a plastic such as, for example, PBT (polybutylene terephthalate). Lead solder may be used for the solder member 15 instead of silver solder.

Figure 4:
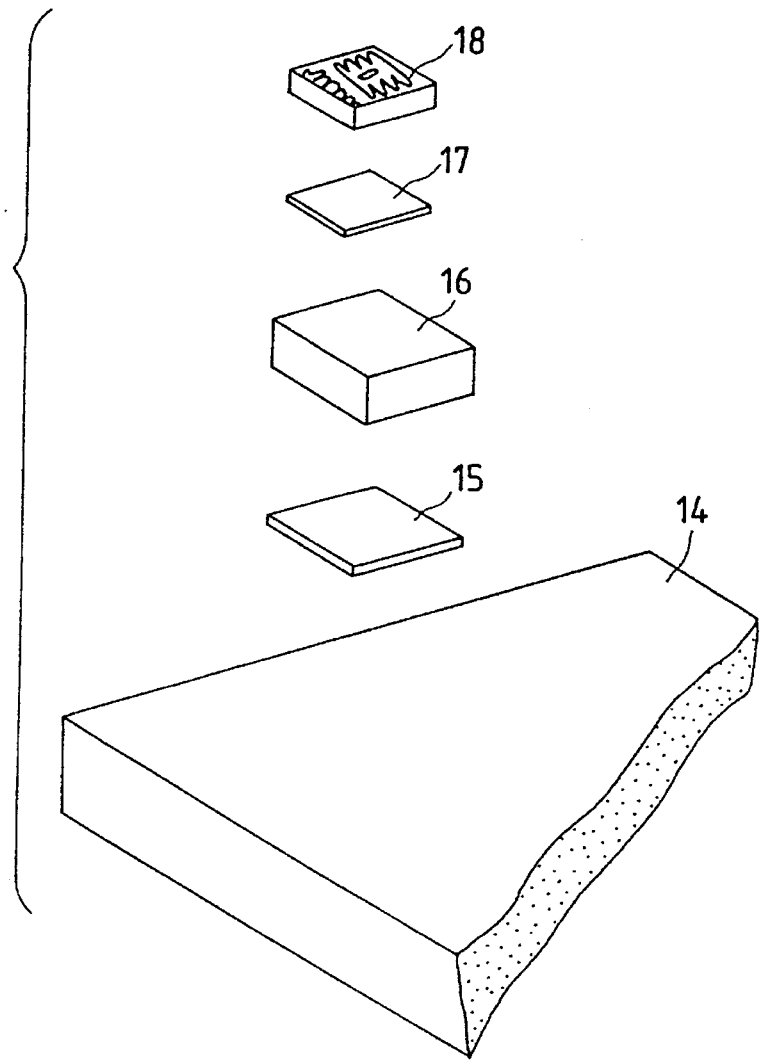
FIG. 4 is a schematic exploded view showing the multilayered structure of a power transistor part.

FIG. 4 is a schematic exploded view showing the multilayered structure of a power transistor part. The molybdenum plate 16 5 mm wide by 5 mm high, 0.5 mm thick is laid on the copper base 14 20 mm wide by 20 mm high, 2 mm thick through solder member 15, the molybdenum plate 16 being fixed to the copper plate 14 by heating them at 650° C. to melt the solder member 15.

Figure 5:
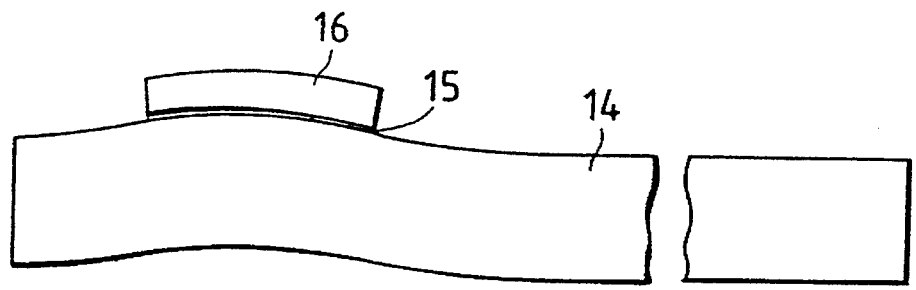
FIG. 5 is a schematic view showing the state of a copper base and a molybdenum plate returned to the room temperature after being fixed to each other with silver solder.
Figure 6:
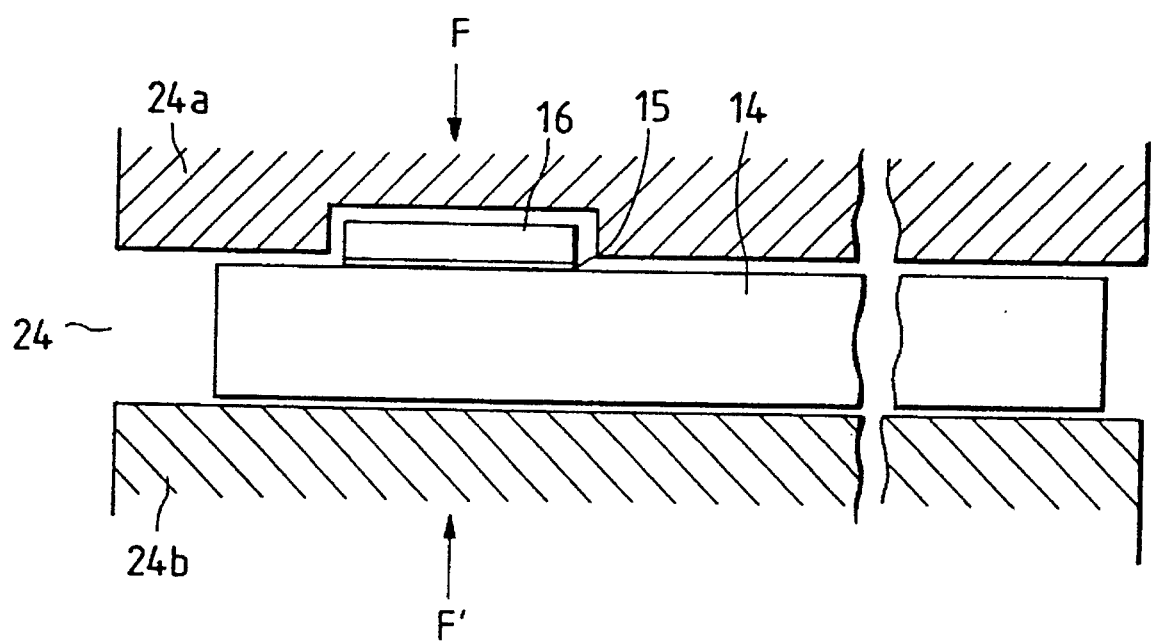
FIG. 6 is a schematic view showing the state of a copper base and a molybdenum plate having flatness given through plastic deformation using a press machine.

The multilayered member formed by fixing the molybdenum plate 16 to the copper base 14 in such a way deforms into such a shape that the multilayered member bows protrusively toward the molybdenum plate 16 side as shown in FIG. 5 due to the difference in the linear expansion coefficients when cooled to the room temperature. The reason why the deformation is caused is because the amount of thermal expansion deformation of the copper base 14 is approximately three times as large as that of the molybdenum plate under a high temperature of 650° C. to melt the solder member 15 for fixing, which leads to the deformation (unevenness) when they are cooled to the room temperature. If the power transistor chip 18 is fixed on the molybdenum plate 16 with solder 17 while the deformation remains, the reliability (thermal resistivity) is decreased since cracking is caused during fixing or the solder layer becomes non-uniform.

In order to prevent such a problem from arising, the deformed copper base 14 fixed to the molybdenum plate 16 is placed between the upper pressing mold 24a and lower pressing mold 24b of a press machine 24, being pressed with pressure (F,F') of approximately 600 kgf.cm to make it into a flat-shape through elastic deformation. Therein, the pressing condition is selected for the case of the copper base (heat sink) 14 having thickness of 1 to 2 mm. The pressure is determined depending on the size and the thickness of the copper base 14 and the molybdenum plate 16 to be pressed. The optimum pressure is selected depending on the dimensions. After the flatness of the copper base 14 and the molybdenum plate 16 is obtained, the power transistor chip 18 is fixed to the molybdenum plate 16 with the solder 17. Thus installation of the power transistor chip 18 is completed.

On the other hand, although the hybrid IC substrate 19 is also fixed on the copper base 14 with adhesive which is not shown in the figure, no cracking is caused in the alumina plate of the hybrid IC substrate 19 since the flatness in the copper base is kept in this case.

As described above, according to the embodiment, by means of keeping the flatness in the copper base 14 and in the molybdenum plate 16 through elastic working, cracking does not occur in the power transistor chip 18, the hybrid IC substrate 19 or the solder member 15 due to thermal deformation during fixing or during operation. Therefore, the reliability of the device of this kind is substantially improved.

As described above, according to the present invention, since the multilayered member formed by fixing a molybdenum plate to a copper base for mounting a power transistor chip is given flatness by eliminating its deformation in the member caused by heated fixing through elastic working, it is possible to prevent cracking in a power transistor chip or a solder layer caused by the deformation. Especially, it is possible to improve the reliability of an electronic distributing type ignition device mounted on an engine block formed in a unit of an ignition controller and an ignition coil.

What is claim is:

1. An electronic distributing type ignition device formed in a unit of an ignition coil for each of spark plugs and an ignition controller having a power transistor for controlling said spark plug, wherein said power transistor in said ignition controller is mounted on and fixed to a molybdenum plate in a multilayered member formed by fixing the molybdenum plate on the fixing surface of a copper base and by flatting each of the surfaces.

2. An electronic distributing type ignition device according to claim 1, wherein said multilayered member formed by fixing the molybdenum plate on the copper base is flattened in each of the surfaces through elastic working.

3. An electronic distributing type ignition device according to claim 1, wherein said ignition controller has a hybrid IC substrate mounted on the copper base.

\* \* \* \* \*